United States Patent [19]
Ikeno et al.

[11] Patent Number: 5,155,060
[45] Date of Patent: Oct. 13, 1992

[54] METHOD FOR FORMING FILM OF UNIFORM THICKNESS ON SEMICONDUCTOR SUBSTRATE HAVING CONCAVE PORTION

[75] Inventors: Masahiko Ikeno; Hideo Saeki; Hiroshi Kawashima, all of Hyogo, Japan

[73] Assignee: Mitsubishi Denki Kabushiki Kaisha, Tokyo, Japan

[21] Appl. No.: 656,725

[22] Filed: Feb. 19, 1991

[30] Foreign Application Priority Data

Jan. 19, 1988 [JP] Japan ............................... 63-9957
Sep. 29, 1988 [JP] Japan ............................. 63-245779

[51] Int. Cl.$^5$ ............... H01L 21/302; H01L 21/304; H01L 21/306
[52] U.S. Cl. ................................. 437/67; 437/229; 437/231; 430/325; 430/326
[58] Field of Search ................ 437/229, 67, 231; 430/328, 326

[56] References Cited

U.S. PATENT DOCUMENTS 4,088,490  5/1978  Duke et al. .................... 437/229
4,665,010  5/1987  Herd et al. .................... 437/229

FOREIGN PATENT DOCUMENTS 150359  8/1985  European Pat. Off. ........... 437/229

Primary Examiner—Brian E. Hearn
Assistant Examiner—Kevin M. Picardat
Attorney, Agent, or Firm—Lowe, Price, Le Blanc & Becker

[57] ABSTRACT

A photoresist of sufficient thickness to fill a scribe line is applied to an entire substrate. The photoresist is exposed through a photomask having a pattern corresponding to the scribe line and then developed. A photosensitized gelatin is applied by spincoating on the flat substrate obtained in this process, pattern and then dyed, to obtain a color filter array.

11 Claims, 11 Drawing Sheets

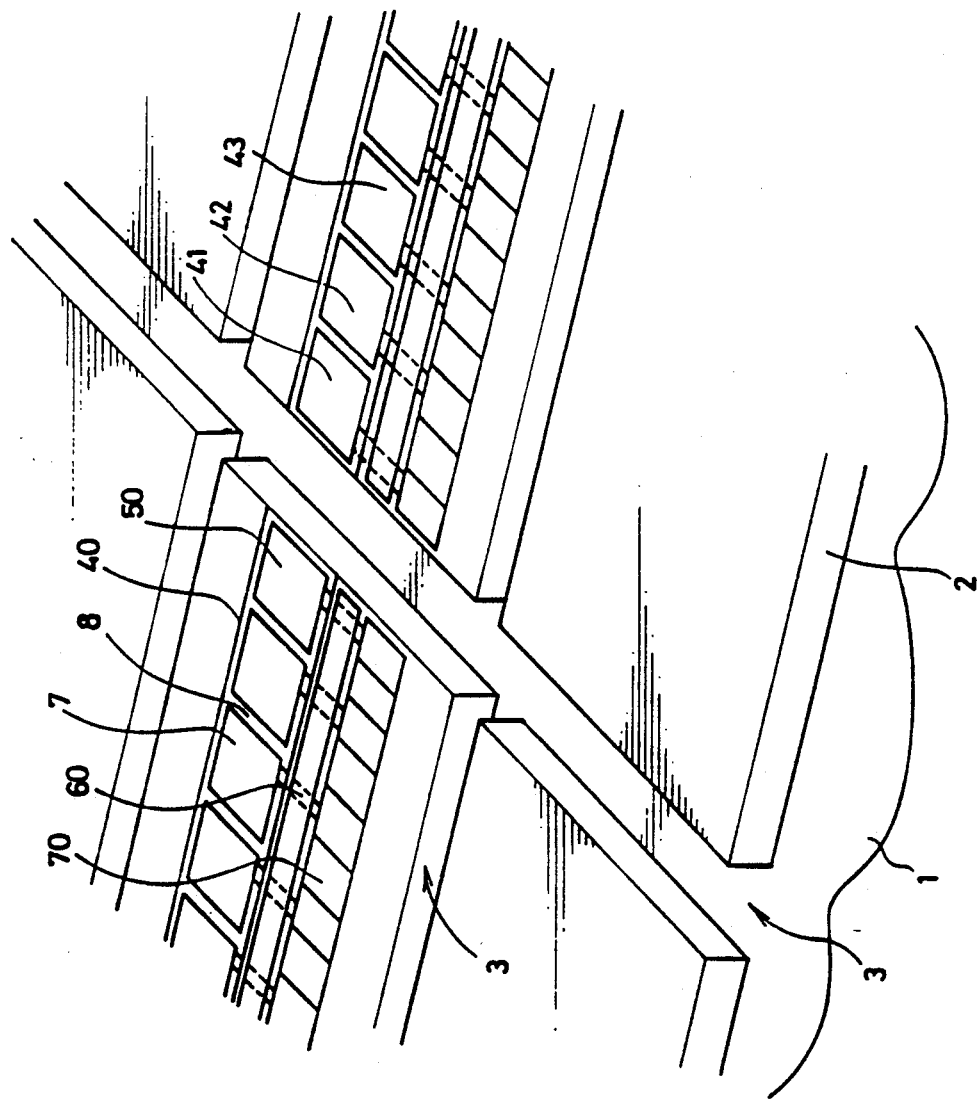

METHOD FOR FORMING FILM OF UNIFORM THICKNESS ON SEMICONDUCTOR SUBSTRATE HAVING CONCAVE PORTION

This is a continuation-in-part application of U.S. patent application Ser. No. 07/297,623 filed on Jan. 17, 1989.

BACKGROUND OF THE INVENTION

1. Field of the Invention

The present invention relates generally to a film forming method, and more particularly, to a method for forming a film of uniform thickness on a semiconductor substrate having a concave portion.

2. Description of the Background Art

In the manufacturing process of a semiconductor device, fine shapes such as a transistor and an interconnection are formed on a semiconductor substrate through complex processes including a plurality of times of the photolithographic process. A complex irregular shape can be formed on the substrate through such processes. In the subsequent photolithographic process, nonuniformity of thickness of a photoresist film due to such an irregular shape is caused in applying a photoresist material by spin-coating. In particular, a scribe line which is a trench for isolating a plurality of chips formed on the substrate presents irregularity larger in scale than fine irregularity inside of a chip, so that nonuniformity of thickness of the resist film caused by the irregularity becomes larger.

FIG. 1A to 1D are cross-sectional views showing manufacturing processes of a semiconductor device in a film forming method which is the background of the present invention. As shown in FIG. 1A, a scribe line 3 is provided on a semiconductor substrate 1 for isolating chips 2. The width of the scribe line 3 is 80 to 150 μm and the depth thereof is 1 to 5 μm.

When a photoresist of, for example, a positive type is directly applied to this semiconductor substrate 1, e.g., by spin-coating, the thickness of the applied photoresist 4 becomes thinner in the vicinity of the scribe line 3 than that in another portion, as shown in FIG. 1B. When a predetermined region of such a photoresist of non-uniform thickness is irradiated with light (represented by an arrow) using a photomask 5 having patterns 51 of the same line width as shown in FIG. 1C and then developed, a photoresist pattern 6a in the vicinity of the scribe line 3 becomes thinner and narrower than a photoresist pattern 6b far away therefrom.

FIGS. 2A to 2B are cross-sectional views showing other manufacturing processes of a semiconductor device in the film forming method which is the background of the invention, showing a case in which there is formed a pattern of an on-chip type color filter material for a solid state imager. As shown in FIG. 2A, a lot of photodiodes 7 are arranged in a line manner or an array manner on chips 2 isolated from each other by a scribe line 3 on a semiconductor substrate 1. An oxide film 8 for isolation is formed between the adjacent two photodiodes 7. A material known to be suitable for such a film 8 is silicon diode. The photodiodes 7 are arranged closer to the scribe line 3. When a negative type photosensitized gelatin is applied on such a semiconductor substrate 1 as a color filter material, the thickness of a photosensitized gelatin film 9 generally becomes thinner in the vicinity of the scribe line, as shown in FIG. 2B. Then, when predetermined regions of the gelatin photosensitive film 9, for example, regions on the photodiodes 7 are selectively irradiated with light using a photomask 5 as shown in FIG. 2C and then developed, a gelatin pattern 10a in the vicinity of the scribe line 3 becomes thinner than a gelatin pattern 10b far away therefrom, as shown in FIG. 2D. Thereafter, each gelatin pattern is subjected to dyeing processing. There occurs a difference in spectral transmittance characteristics between the dyed gelatin pattern 10a in the vicinity of the scribe line 3 and the dyed gelatin pattern 10b far away therefrom even if the gelatin patterns are respectively color filters of the same color. Thus, there occurs a difference between respective spectral response of the photodiodes 7 corresponding to the gelatin patterns 10a and 10b.

In the above described two examples, the thickness of the gelatin photosensitive film in the vicinity of the scribe line is thinner than that in another portion. However, a coating material may protrude on a side of the scribe line at the time of application by spinning depending on the nature of the material to be coated, for example, the viscosity, the surface tension and the like. Such a phenomenon is described in an article by Ikeno et. al., entitled "Effects of Superficial Topography on Uniformity of Spun-on Resist Film", EXTENDED ABSTRACTS in Fall Meeting of The Electrochemical Society held in October, 1988 Vol. 88-2, pp. 1041-1042.

As described in the foregoing, in the conventional film forming method, a film of a photoresist, a color filter material or the like becomes thin or thick in the vicinity of a concave portion such as a scribe line on a semiconductor substrate. Thus, uniformity of the pattern size of the resist or the thickness of the film is decreased, so that a semiconductor device as designed cannot be obtained. In addition, spectral transmittance characteristics of a color filter film and spectral response of the photodiode become non-uniform depending on the position of the gelatin pattern on the chip. Thus, the characteristics of a solid state imager so formed are not entirely satisfactory.

In order to solve the above-described problems, the thickness of the film is made thick in practice so that the effect due to the difference in thickness is decreased. However, in such a case, the resolution in patterning the film is lowered and the reliability is decreased. In addition, much time is required for exposure and development.

SUMMARY OF THE INVENTION

An object of the present invention is to provide a method for forming film which is uniform in thickness irrespective of whether it is located in the vicinity of or far away from a concave portion on a semiconductor substrate.

The film-forming method according to the present invention comprises the steps of forming a film of a first material for filling a concave portion on a semiconductor substrate, selectively removing this film of a first material in a portion other than the concave portion, and forming a film of a second material thereon.

In accordance with another aspect of the present invention, a color filter is formed on a semiconductor substrate after filling a scribe line on a semiconductor substrate.

In accordance with still another aspect of the present invention, a plurality of chip regions each having a solid state imager comprising a photoelectric converting portion, an electric charge transferring portion and a driving circuit formed therein and a concave portion for dividing the plurality of chip regions are formed on a semiconductor substrate. A color filter array is formed after filling the concave portion.

In accordance with a further aspect of the present invention, a first film is formed out of a non-photosensitive material on a main surface of a semiconductor substrate having a concave portion, a second film is formed out of a photosensitive material on the first film, the second film existing in a portion other than the concave portion is removed and then the first film is etched by using the remaining second film as a mask to obtain the arrangement wherein the concave portion is filled with the non-photosensitive material.

In a method according to the present invention, a concave portion is filled with a first material and the first material in a portion other than the concave portion is selectively removed, so that a flat surface is obtained. A film of a second material is formed on the flat surface, so that this film becomes uniform.

Thus, the color filter manufactured in the film forming method according to the present invention has uniform spectral transmittance characteristics, so that characteristics of a solid state imager having this color filter is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a perspective view showing a semiconductor substrate, in which linear imagers are formed, according to the third and fourth embodiments.

DESCRIPTION OF THE PREFERRED EMBODIMENTS

FIGS. 3A to 3G are cross-sectional views illustrating manufacturing processes of a semiconductor device in a film forming method according to the present invention.

Figure 3A:
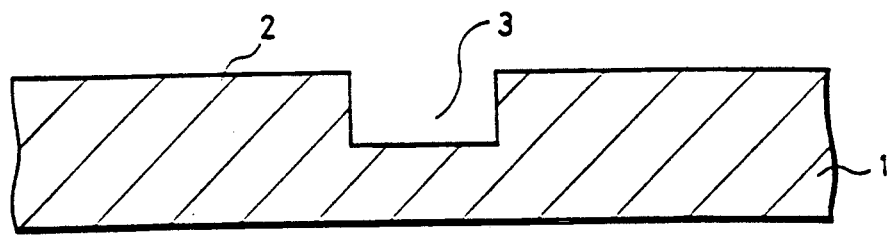
FIGS. 3A to 3G are cross-sectional views illustrating manufacturing processes of a semiconductor device in a film-forming method according to a first embodiment of the present invention.
Figure 3B:
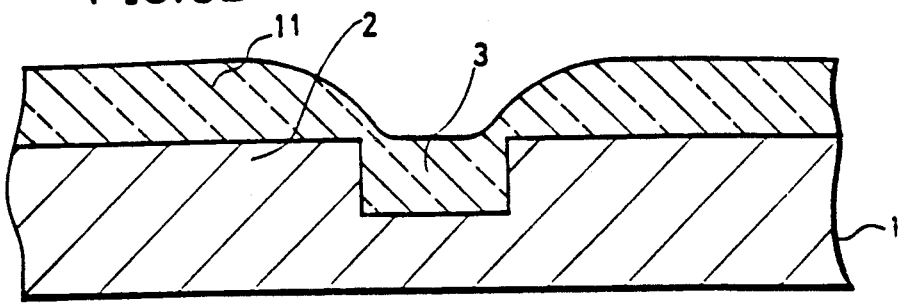
Figure 3C:
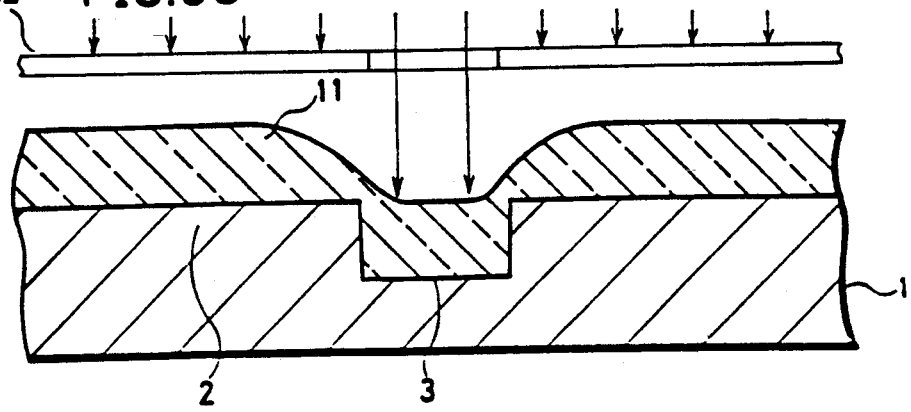
Figure 3D:
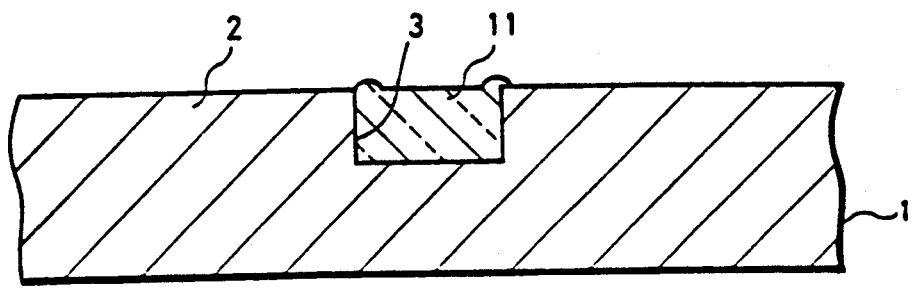
Figure 3E:
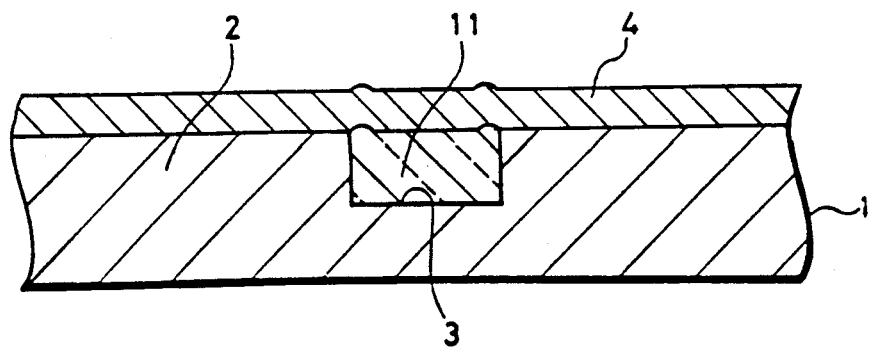
Figure 3F:
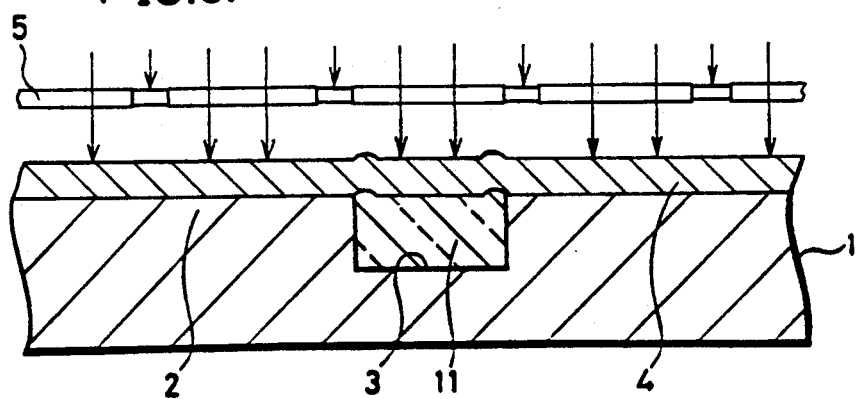
Figure 3G:
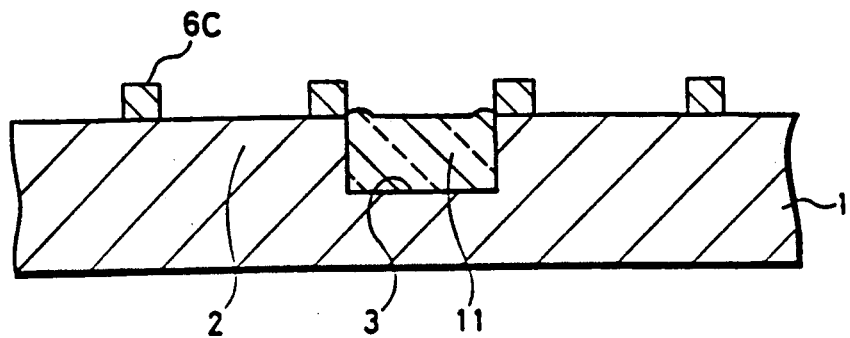

As shown in FIG. 3A, a scribe line 3 for isolating chips 2 is provided on a semiconductor substrate 1. Then, as shown in FIG. 3B, a negative type photoresist 11 of sufficient thickness to fill the scribe line 3 is applied by spin-coating. Then, as shown in FIG. 3C, the photoresist 11 on the scribe line 3 is exposed to UV light using a photomask 12 having a pattern corresponding to the scribe line 3. When the resist pattern is developed using an organic developer and baked, the scribe line 3 is selectively filled with the negative type photoresist 11 as shown in FIG. 3D, so that the surface becomes flat throughout. A positive type photoresist 4 is applied thereon by spin-coating. Since the negative type photoresist 11 is insoluble in a solvent for the positive type photoresist by exposing, developing and baking processing, a film of a positive type photoresist 4 of uniform thickness is obtained as shown in FIG. 3E. Subsequently, the film is exposed to light through a photomask 5 as shown in FIG. 3F and developed, so that photoresist patterns 6c are obtained as shown in FIG. 3G. There is no difference in the patterns 6c in the vicinity of and far away from the scribe line 3.

Figure 1A:
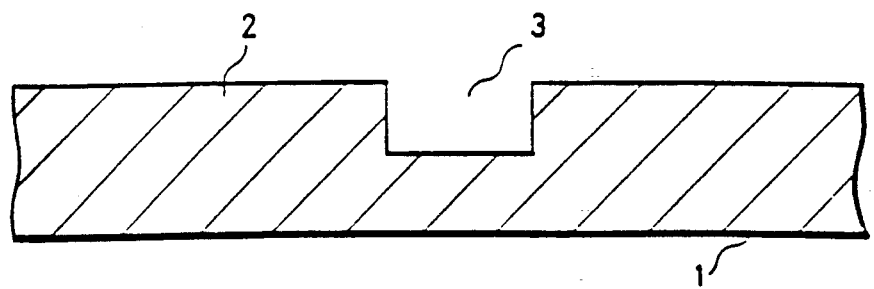
FIG. 1A to 1D are cross-sectional views illustrating manufacturing processes of a semiconductor device in a film-forming method which is the background of the invention.
Figure 1B:
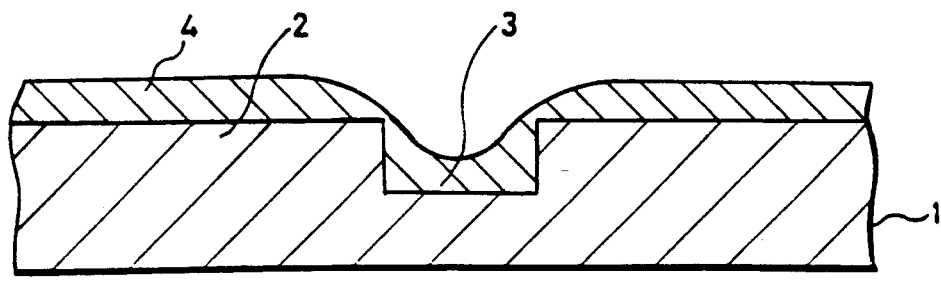
Figure 1C:
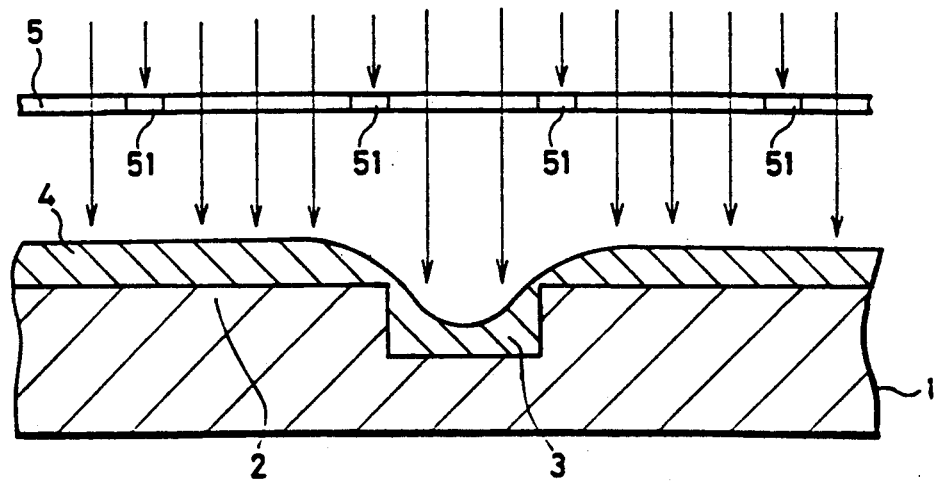
Figure 1D:
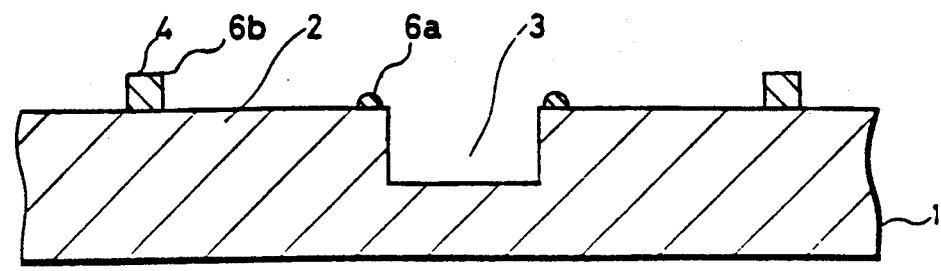
Figure 2A:
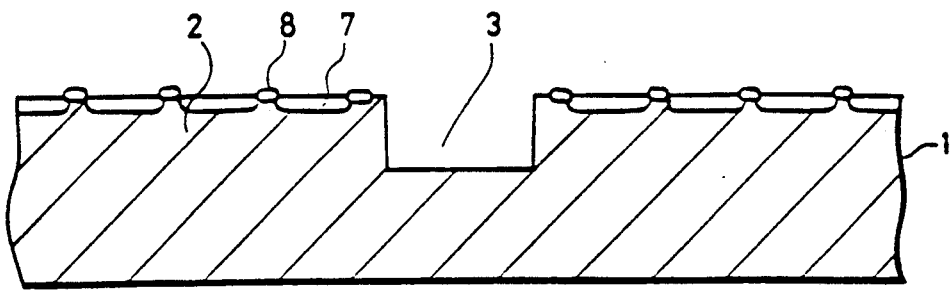
FIGS. 2A to 2D are cross-sectional views illustrating other manufacturing processes of a semiconductor device in the film-forming method which is the background of the present invention.
Figure 2B:
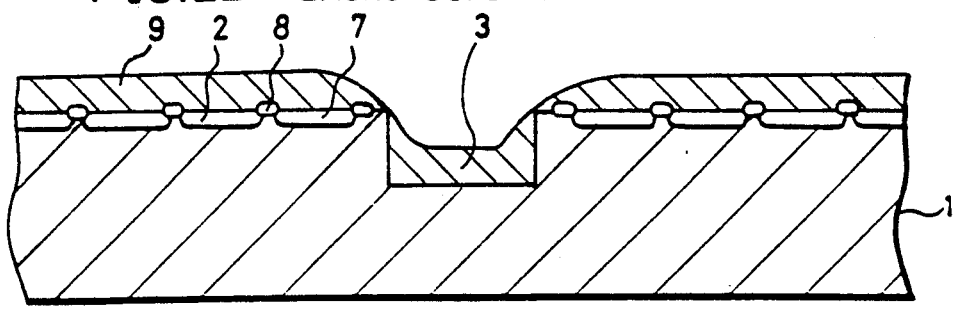
Figure 2C:
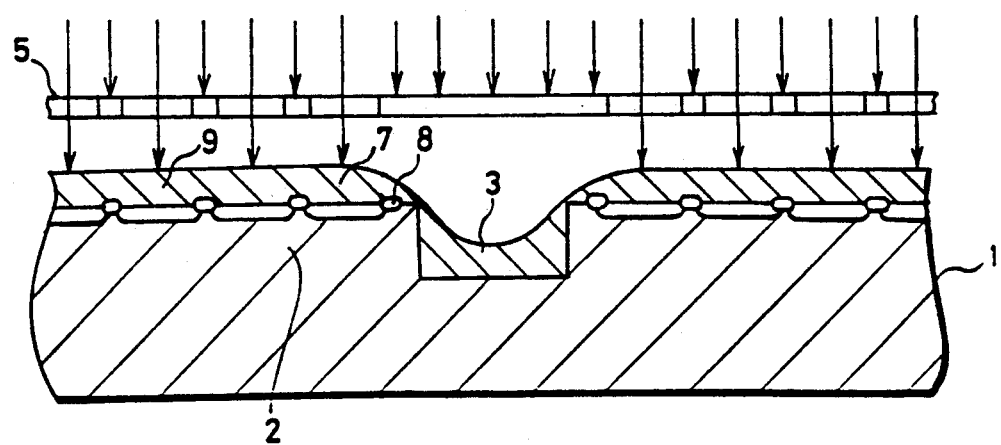
Figure 2D:
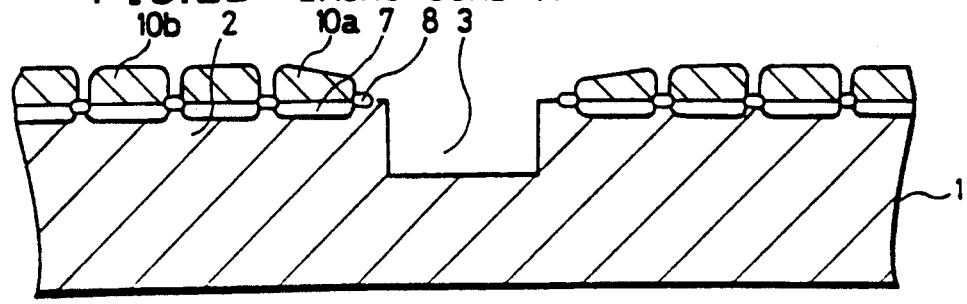
Figure 4A:
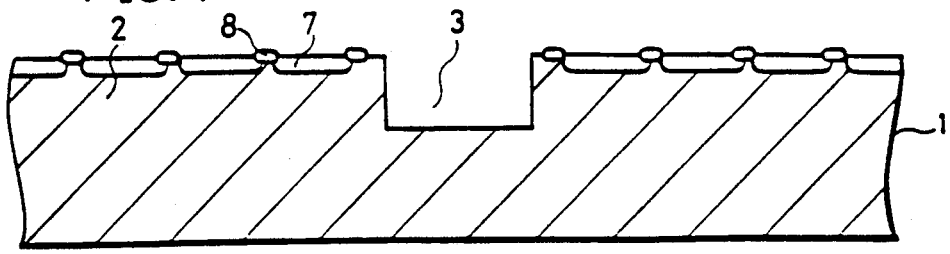
FIGS. 4A to 4G are cross-sectional views illustrating manufacturing processes of a semiconductor device in a film-forming method according to a second embodiment of the present invention.
Figure 4B:
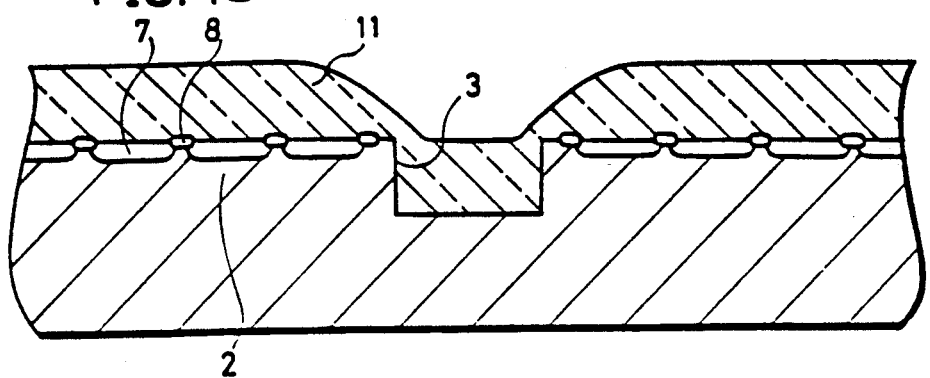
Figure 4C:
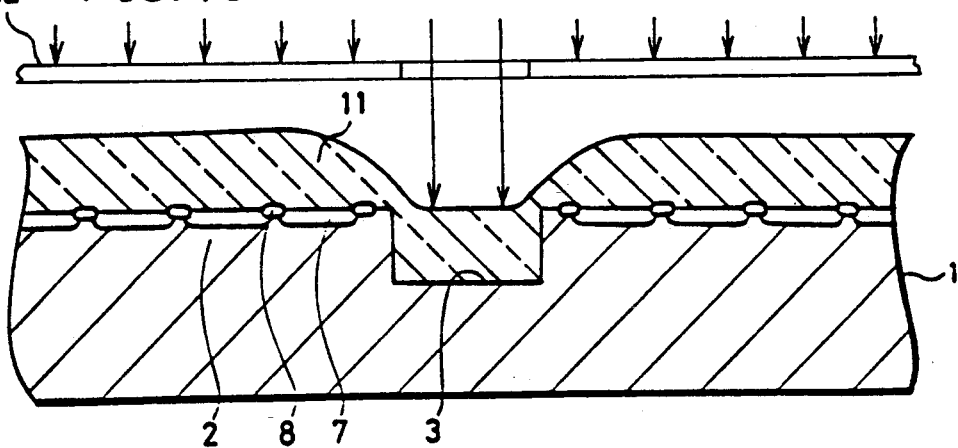
Figure 4D:
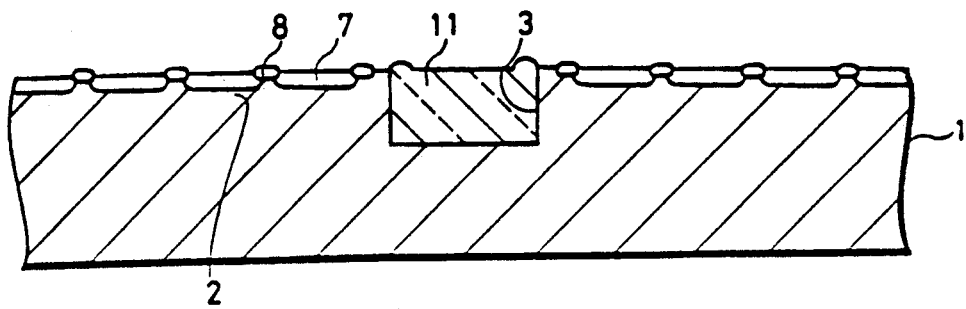
Figure 4E:
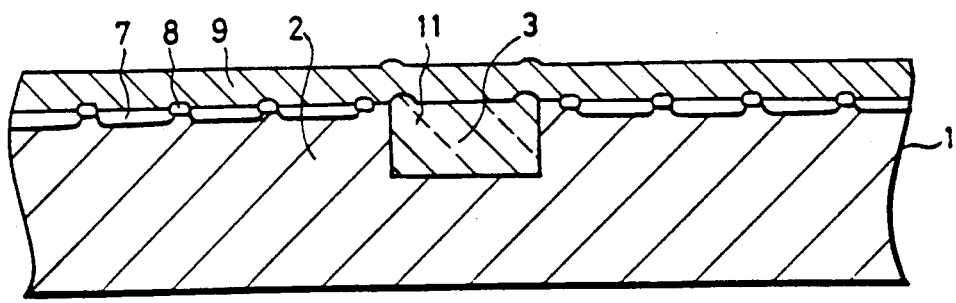
Figure 4F:
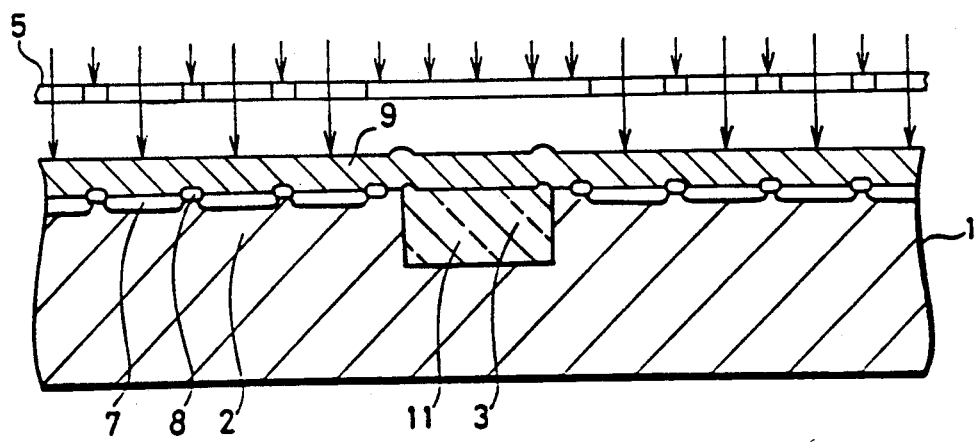
Figure 4G:
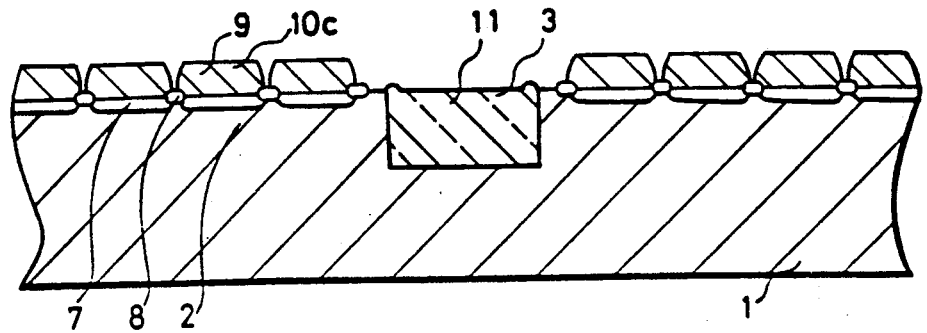

FIGS. 4A to 4G are cross-sectional views illustrating manufacturing processes of a semiconductor device in a film forming method according to another embodiment of the present invention, showing a case in which a pattern of an on-chip type color filter material for a solid state imager is formed. FIG. 4A is the same as FIG. 2A and hence, the description thereof is omitted. As shown in FIG. 4B, a negative type photoresist 11 soluble in organic solvent applied to sufficient thickness to fill a scribe line 3. Then, as shown in FIG. 4C, the photoresist 11 on the scribe line 3 is exposed to light using a photomask 12 having a pattern corresponding to the scribe line 3. When the resist pattern is developed and baked, the scribe line 3 is selectively filled with the negative type photoresist 11 as shown in FIG. 4D, so that the surface becomes flat throughout. When a photosensitized gelatin soluble in water is applied thereon by spin-coating, a gelatin photosensitive film 9 of uniform thickness is obtained as shown in FIG. 4E. Then, when predetermined regions of the gelatin photosensitive film 9, for example, regions on photodiodes 7 are exposed to deep UV light using a photomask 5 as shown in FIG. 4F and then developed, gelatin patterns 10c are obtained as shown in FIG. 4G. There is no difference in thickness between the patterns 10c in the vicinity of and far away from the scribe line 3. That is, the patterns on any photodiodes 7 in a chip are uniform in thickness and width. Thereafter, each of the gelatin patterns is subjected to dyeing processing, so that a color filter array is obtained.

Although in FIG. 3G showing the first embodiment and FIG. 4G showing the second embodiment the photoresist 11 is left in the scribe line 3, this photoresist 11 may be removed in the subsequent processes or may be left.

Although in the above described first and second embodiments, a negative type photoresist is used as a first material for filling a concave portion such as a scribe line 3, a material having either negative or positive type sensitivity may be used, provided it is insoluble in a solvent including a second material used as a film forming after filling the concave portion to be a flat surface.

In the above-described second embodiment, color filters are formed on the same surface. Description is now provided on an example in which color filters are stacked.

Figure 5A:
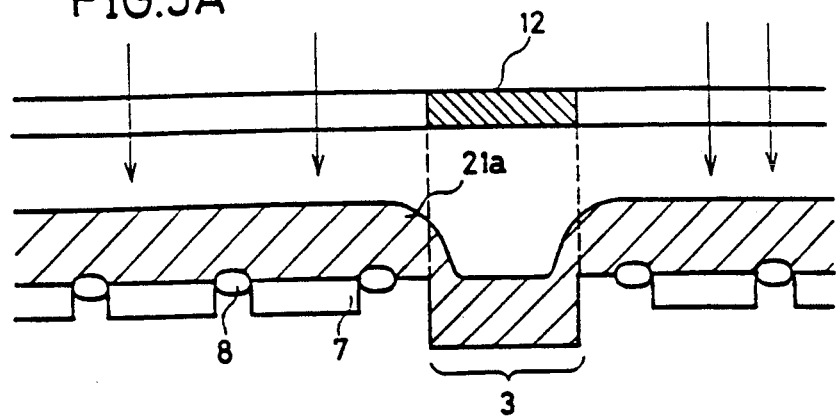
FIGS. 5A to 5H are cross-sectional views illustrating manufacturing processes of a solid state imager in a film-forming method according to a third embodiment of the present invention.

First, as shown in FIG. 5A, a positive type photosensitive polymer 21a of sufficient thickness to considerably fill a deep stepped portion such as a scribe line 3 is formed on a Si substrate having a photoelectric converting portion, an electric charge transferring portion and a driving portion formed thereon by using spin-coating, or the like.

Figure 5B:
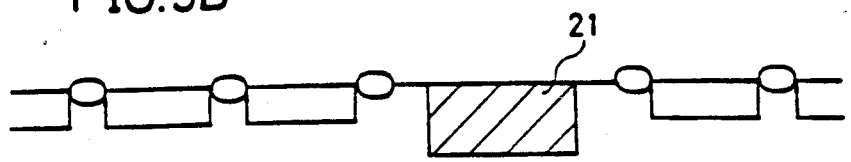

Subsequently, a portion other than the stepped portion is exposed to light using a photomask 12. Then, as shown in FIG. 5B, the portion is removed by development, to form a filled layer 21.

Figure 5C:
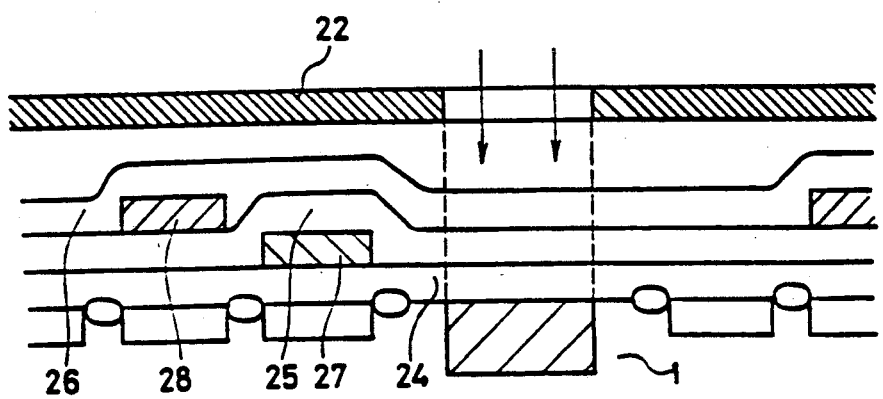

Then, as shown in FIG. 5C, a smoothening layer 24 is formed on a semiconductor substrate 1.

Then, a base material used for a filter such as gelatin, casein, PVA (polyvinyl alcohol) or the like having photosensitivity by adding ammonium dichromate or the like is applied, by using a spin-coating procedure or the like, to form a filter pattern using photolithographic techniques. This filter pattern is dyed using a dyeing method, to form a first color filter layer 27 having desired spectral transmittance characteristics.

Similarly, a second color filter layer 28 is formed through an intermediate layer 25 formed of a transparent polymer, and then a protective layer 26 is formed of a transparent polymer. A positive type photosensitive polymer is used as an interlayer film such as the smoothening layer 24, the intermediate layer 25 and the protective layer 26.

Finally, the unnecessary transparent polymers 24, 25 and 26 and the filled layer 21 on the scribe line 3 are simultaneously exposed to light using a photomask 22.

Figure 5D:
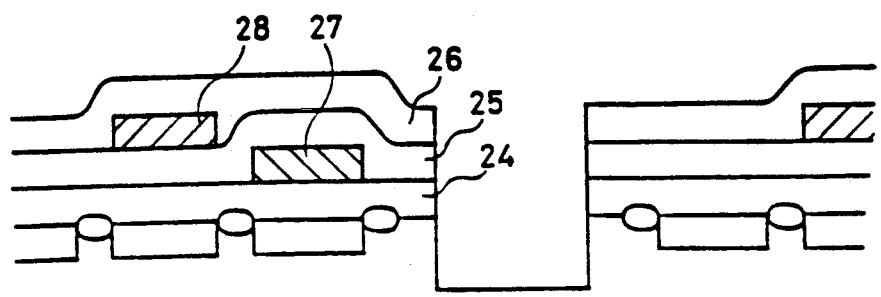

Then, as shown in FIG. 5D, the above-described layers on the scribe line are simultaneously removed by development.

Figure 5E:
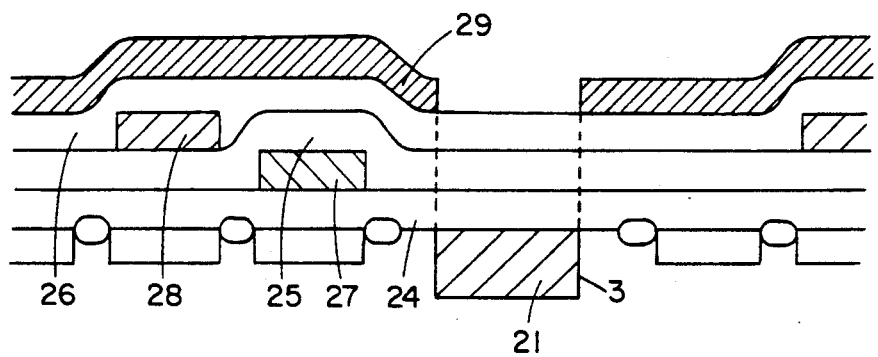
Figure 5F:
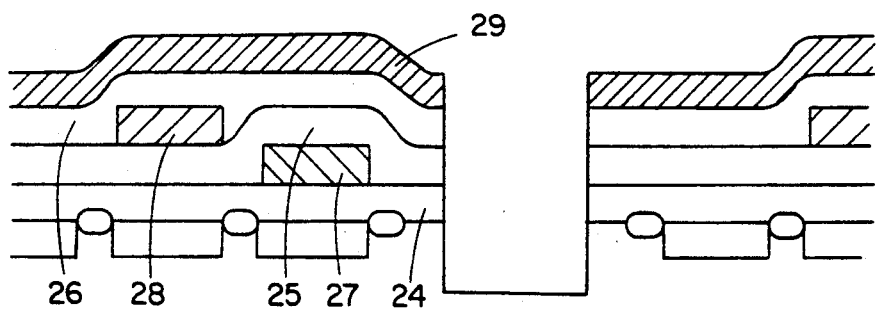
Figure 5G:
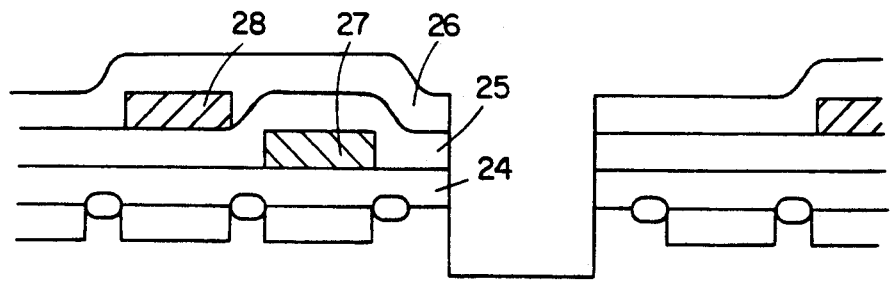

FIGS. 5E to 5G are views showing the modified example of the embodiment shown in FIGS. 5A to 5D and FIG. 5H is a view showing another modified example thereof.

Figure 5H:
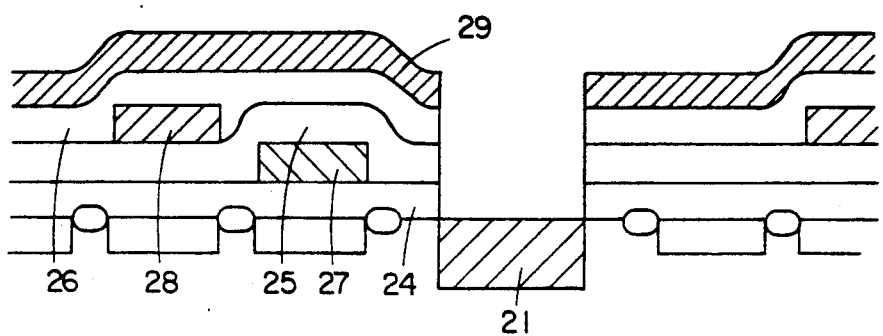
Figure 6A:
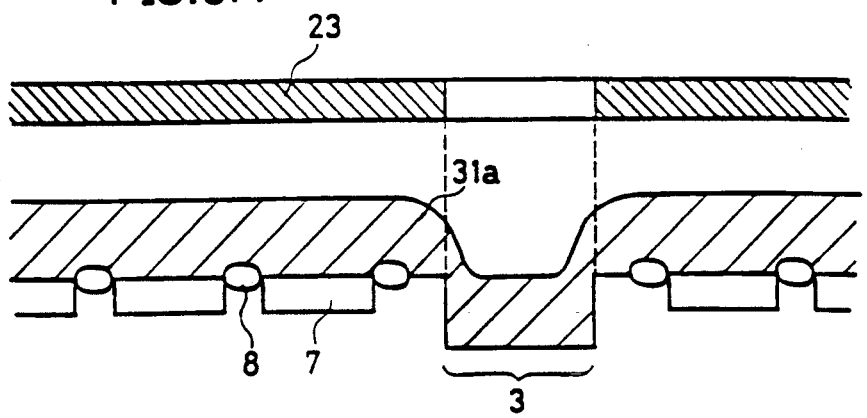
FIGS. 6A to 6D are cross-sectional views illustrating manufacturing processes of a solid state imager in a film-forming method according to a fourth embodiment of the present invention.
Figure 6B:
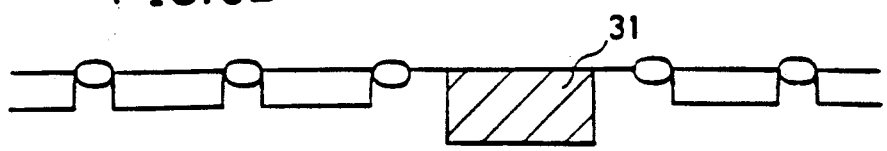

The arrangement shown in FIG. 5E is formed by using the same process as shown in FIGS. 5A to 5C. First, a positive type resist for filling a scribe line 3 is formed on the Si substrate by using spin-coating as shown in FIG. 5A and then, other portion than the scribe line 3 is exposed to light by using a photomask 12 as shown in FIG. 5A. Then, the portion exposed to light is removed by development to form a filled layer 21 as shown in FIG. 5B. Subsequently, a smoothening layer 24, a first color filter layer 27, an intermediate layer 25, a second color filter layer 28 and a protective layer 26 are formed in the same manner as described with reference to FIG. 5C. Then, a photoresist film 29 having an opening positioned to correspond to the scribe line 3 is formed on the protective layer 26 to achieve the arrangement shown in FIG. 5E. Then, the protective layer 26, the intermediate layer 25, the smoothening layer 24 and the filled layer 21 are removed by etching using the photoresist film 29 as a mask as shown in FIG. 5F. Then as shown in FIG. 5G, the photoresist 29 is removed. FIG. 5H shows the process of removing the protective layer 26, the intermediate layer 25 and the smoothening layer 24 by etching shown in FIG. 5E and then developing the filled layer 21 by exposing the same to UV light, for example, to remove the filled layer 21. The same arrangement as shown in FIG. 5G can be obtained by removing the photoresist film 29 after the removal of the filled layer 21. The photoresist film 29 can be removed by using a developer for use in removing the filled layer 21. Although in the above-described third embodiment, the filled layer is formed of the positive type photosensitive polymer, it may be formed of a negative type photosensitive polymer. Description is now provided of an example in which a negative type photosensitive polymer is used. First, as shown in FIG. 6A, a negative type photosensitive polymer 31a of sufficient thickness to considerably fill a deep stepped portion such as a scribe line 3 is formed using application by spin-coating, or the like. Subsequently, the stepped portion to be filled is exposed to light using a photomask 23. Then, as shown in FIG. 6B, an unnecessary portion is removed by development, to form a filled layer 31.

Figure 6C:
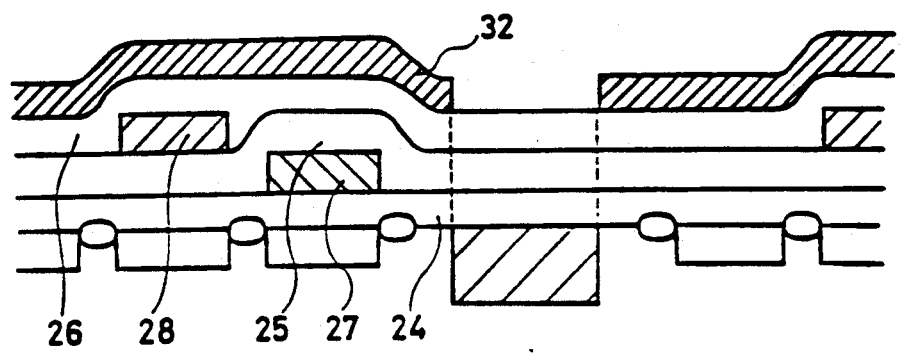
Figure 6D:
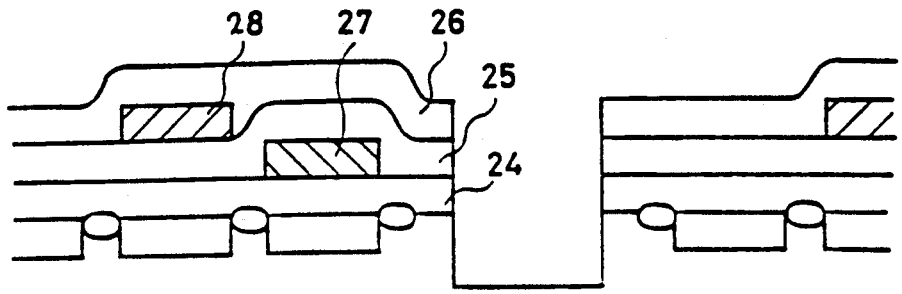

In the same manner as that in the above-described third embodiment, a color filter array comprising a smoothening layer 24, a first color filter layer 27, an intermediate layer 25, a second color filter layer 28 and a protective layer 26 is formed as shown in FIG. 6C and then, a photoresist 32 is applied. Then, as shown in FIG. 6D, the filled layer 31 and the polymer layers 24, 25 and 26 are removed by etching, utilizing the above described resist 32 as a mask.

Finally, the remaining photoresist 32 is stripped.

It does not matter whether materials of the filled layer 31 and the transparent interlayer films 24, 25 and 26 are inorganic or organic provided they can be etched. For example, transparent thermosetting resin can be used as the interlayer films 24, 25 and 26. However, it is desirable to select the materials, together with etching materials, such that the etching speed of the photoresist 32 is lower than those of the filled layer 31 and the transparent interlayer films 24, 25 and 26, and the filled layer 31 and the transparent interlayer films 24, 25 and 26 are simultaneously etched.

FIG. 7 shows a semiconductor substrate, in which a linear imagers are formed, according to third and fourth embodiments. As shown in FIG. 7, a scribe line 3 is provided lengthwise and breadthwise on a semiconductor substrate 1. Each of chip regions 2 divided by the scribe line 3 is provided with a photoelectric converting portion 50 having photodiodes 7 arranged in a single line, a transfer gate 60 for reading out the charges from each of the photodiodes, and a CCD (Charge Coupled Device) 70 for transferring the charges as read out. A color filter array 40 is formed on the photoelectric converting portion 50. The color filter array 40 comprises, for example, a red filter 41, a green filter 42 and a blue filter 43. Although linear imagers having RGB-color filter arrays are shown in FIG. 7, any filter may be used provided it constitutes the color filter array. In addition, the photodiodes may be arranged in a matrix.

Figure 8A:
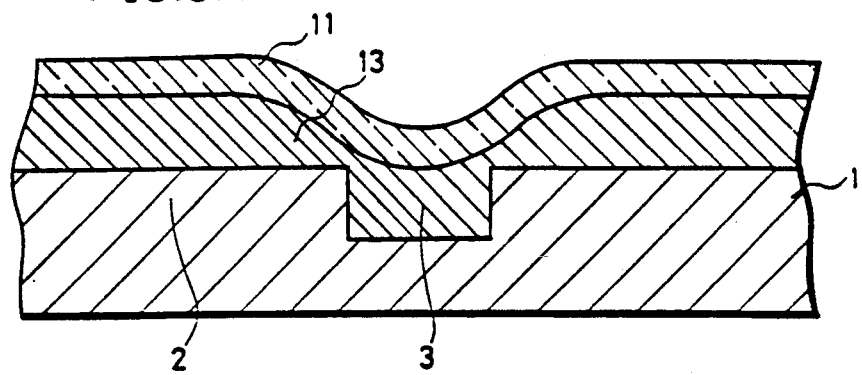
FIGS. 8A to 8D are cross-sectional views illustrating manufacturing processes of a semiconductor device in a film-forming method according to a fifth embodiment of the present invention.
Figure 8B:
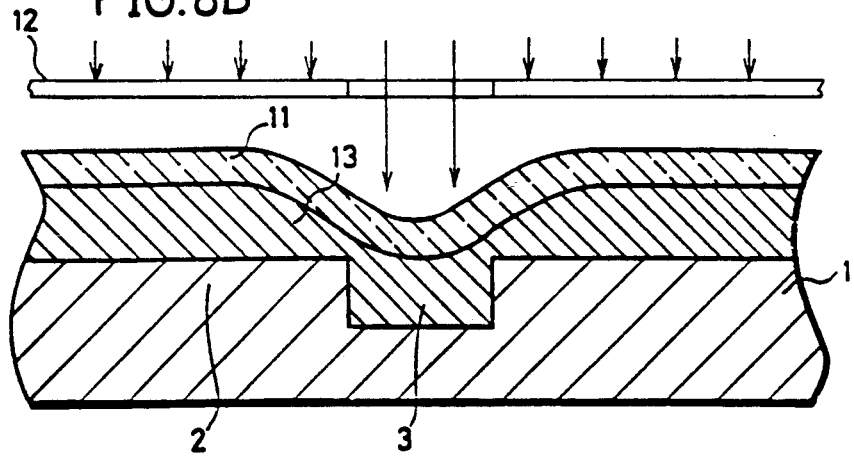
Figure 8C:
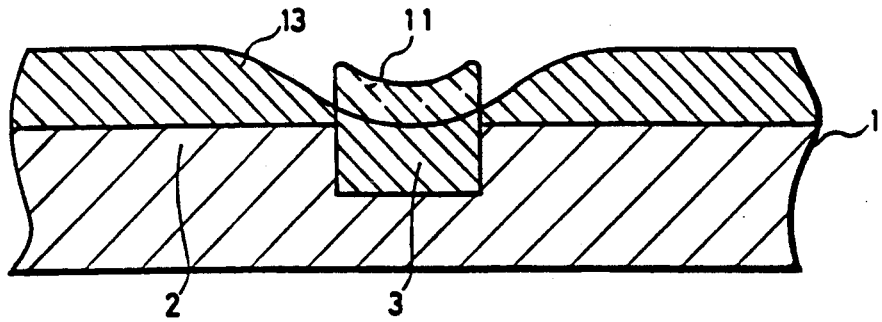
Figure 8D:
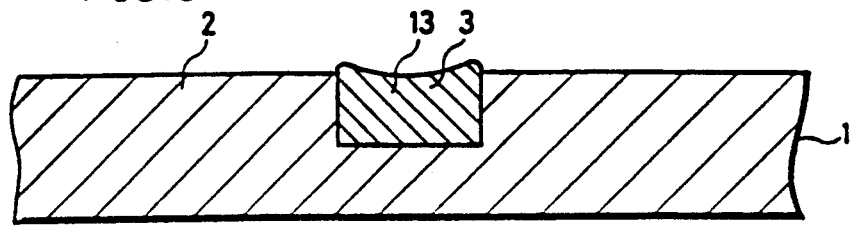

Although a material having sensitivity is used in the above-described embodiment as a first material for filling a concave portion such as a scribe line, a material having no sensitivity, e.g., a thermosetting resin, may be used. Description is now provided of such an embodiment. FIGS. 8A to 8D are cross-sectional views illustrating processes of a semiconductor substrate corresponding to the processes shown in FIGS. 3B to 3D. The other processes are the same as those in the first embodiment, and the description thereof is omitted. In FIG. 8A, a thermosetting resin 13 is applied on a semiconductor substrate 1, to form a film on sufficient thickness to fill a scribe line 3. A negative type photoresist 11 is applied thereon. As shown in FIG. 8B, a photoresist on the scribe line 3 is exposed to light using a mask 12 having a pattern corresponding to the scribe line 3. When the resist pattern is developed and baked, the photoresist 11 remains only in a portion corresponding to the scribe line 3, as shown in FIG. 8C. The thermosetting resin in a portion other than the portion corresponding to the scribe line 3 is removed in known manner by etching, utilizing the remaining photoresist 11 as a mask. When the photoresist 11 is removed by dry etching using oxygen plasma or by organic solvent, the surface becomes flat throughout, as shown in FIG. 8D.

Although in the above described embodiment, a thermosetting resin is used as a first material, the first material is not limited to the same. For example, it may be organic or inorganic provided it can be etched.

Although in the above-described embodiment, a scribe line was discussed as an example of a concave portion, the concave portion is not limited to the same. For example, the concave portion may be a relatively large stepped portion formed on a semiconductor substrate, in which case a film of the same uniform thickness as that in the above-described embodiment can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film forming method for manufacturing a color filter array, comprising the steps of:
   forming, on a major surface of a semiconductor substrate having a scribe line a film out of a first material having a sufficient thickness to fill said scribed line;
   selectively removing said first material from said major surface such that said first material is left in said scribe line; and
   forming a second film on said first material remaining in said scribe line and on said major surface at a portion other than said scribe line to form a color filter array.

2. The film forming method according to claim 1, wherein:
   said step of forming said second film includes the step of coating by spinning a material selected from the group of photosensitive materials consisting of a gelatin photosensitive material, a casein photosensitive material, a polyvinyl alcohol photosensitive material, a dyeable material soluble in water, and a dyeable material soluble in organic solvent; and
   said color filter array is formed by dyeing said second film.

3. A method of forming a film on a semiconductor substrate comprising a plurality of chip regions each having a solid state imager including a photoelectric converting portion, an electric charge transferring portion and a driving portion formed therein, and a concave portion for dividing said plurality of chip regions the method comprising the steps of:
   filling said concave portion with a first material;
   forming a planarizing film on said semiconductor substrate having said concave portion filled with said first material;
   forming a first color filter film at a predetermined region other than said concave portion on said planarizing film;
   forming an intermediate film, for preventing contamination on said planarizing film, to cover said first color filter film;
   forming a second color filter film in a predetermined region other than said concave portion on said intermediate film; and
   forming a protective film on said intermediate film to cover said second color filter film.

4. The film forming method according to claim 3, further comprising:
   the step of removing said first material, said planarizing film, said intermediate film and said protective film on said concave portion.

5. The film forming method according to claim 4, wherein:
   said removing step includes the step of etching said protective film, said intermediate film, said planarizing film and said first material on said concave portion.

6. The film forming method according to claim 4, wherein:
   said planarizing film, said intermediate film and said protective film are formed of thermosetting resin.

7. The film forming method according to claim 4, wherein:
   said first material includes a photosensitive material,
   said removing step includes the step of removing said protective film, said intermediate film and said planarizing film on said concave portion by etching and the step of exposing said first material filled in said concave portion to light and then developing the same to remove said first material.

8. The film forming method according to claim 7, wherein:
   said first material includes a positive type photosensitive material.

9. The film forming method according to claim 4, wherein:
   said protective film, said intermediate film, said smoothening film and said first material includes a transparent photosensitive material; and
   said removing step includes the step of removing said protective film, said intermediate film, said planarizing film and said first material on said concave portion through light-exposure followed by development thereof.

10. The film forming method according to claim 9, wherein:
    said first material includes a positive type photosensitive material.

11. A film forming method, comprising the steps of:
    forming, on a major surface of a semiconductor substrate having a concave portion, a first film out of a non-photosensitive material having a sufficient thickness to fill said concave portion;
    forming a second film out of a photosensitive material on said first film;
    removing said second film in other portion than said concave portion through light-exposure through a predetermined mask followed by development of the same; and
    etching said first film using said second film left on said concave portion as a mask to leave said non-photosensitive material in said concave portion and fully fill said concave portion.

* * * * *